(12) United States Patent
Zenou et al.

(10) Patent No.: US 11,881,466 B2
(45) Date of Patent: Jan. 23, 2024

(54) ELECTRICAL INTERCONNECTION OF CIRCUIT ELEMENTS ON A SUBSTRATE WITHOUT PRIOR PATTERNING

(71) Applicant: ORBOTECH LTD., Yavne (IL)

(72) Inventors: Michael Zenou, Hashmonaim (IL); Zvi Kotler, Tel Aviv (IL); Ofer Fogel, Jerusalem (IL)

(73) Assignee: ORBOTECH LTD., Yavne (IL)

( * ) Notice: Subject to any disclaimer, the term of this patent is extended or adjusted under 35 U.S.C. 154(b) by 319 days.

(21) Appl. No.: 16/495,112

(22) PCT Filed: Apr. 26, 2018

(86) PCT No.: PCT/IL2018/050455
§ 371 (c)(1),
(2) Date: Sep. 18, 2019

(87) PCT Pub. No.: WO2018/216002
PCT Pub. Date: Nov. 29, 2018

(65) Prior Publication Data
US 2021/0028141 A1 Jan. 28, 2021

Related U.S. Application Data

(60) Provisional application No. 62/510,286, filed on May 24, 2017.

(51) Int. Cl.
*H01L 23/00* (2006.01)
*H01L 21/48* (2006.01)

(52) U.S. Cl.
CPC .......... *H01L 24/19* (2013.01); *H01L 21/4846* (2013.01); *H01L 24/73* (2013.01);
(Continued)

(58) Field of Classification Search
CPC ..... H01L 24/19; H01L 21/4846; H01L 24/73; H01L 24/76; H01L 24/82; H01L 24/83;
(Continued)

(56) References Cited

U.S. PATENT DOCUMENTS 3,963,852 A 6/1976 Baxter
4,752,455 A 6/1988 Mayer
(Continued)

FOREIGN PATENT DOCUMENTS

DE 10237732 A1 3/2004
DE 102012003866 B4 7/2013
(Continued)

OTHER PUBLICATIONS

Pique et al. "laser Direct-Write of Embedded Electronic Components and Circuits", International Society for Optical Engineering, Apr. 2005 (Year: 2005).*
(Continued)

*Primary Examiner* — Selim U Ahmed
*Assistant Examiner* — Evan G Clinton
(74) *Attorney, Agent, or Firm* — Hodgson Russ LLP

(57) ABSTRACT

A method for producing electronic devices includes fixing a die that includes an electronic component with integral contacts to a dielectric substrate. After fixing the die, a conductive trace is printed over both the dielectric substrate and at least one of the integral contacts, so as to create an ohmic connection between the conductive trace on the substrate and the electronic component.

20 Claims, 4 Drawing Sheets

(52) U.S. Cl.
CPC .............. *H01L 24/76* (2013.01); *H01L 24/82* (2013.01); *H01L 24/83* (2013.01); *H01L 2224/73259* (2013.01); *H01L 2224/76158* (2013.01); *H01L 2224/82103* (2013.01)

(58) Field of Classification Search
CPC . H01L 2224/73259; H01L 2224/76158; H01L 2224/82103; H01L 2224/76263; H01L 2224/2732; H01L 2224/82009; H01L 2224/83192; H01L 2224/83874; H01L 2224/97; H01L 24/92; H01L 24/97; H01L 24/27; H01L 24/32; H01L 2224/24011; H01L 2224/245; H01L 2224/32225; H01L 2224/76151; H01L 2224/76702; H01L 2224/82986; H01L 2224/83862; H01L 2224/92244; H01L 24/24; H01L 2224/766; H01L 2224/76753; H01L 2224/76901; H01L 2224/82102; H01L 2224/82122; H01L 2924/12041; H05K 2203/0528; H05K 3/305; H05K 2203/107; H05K 2203/128; H05K 2203/1469; H05K 3/10
See application file for complete search history.

(56) References Cited

U.S. PATENT DOCUMENTS

| | | | |
|---|---|---|---|
| 4,891,183 A | 1/1990 | Corwin | |
| 4,895,735 A | 1/1990 | Cook | |
| 4,931,323 A | 6/1990 | Manitt et al. | |
| 4,970,196 A | 11/1990 | Kim et al. | |
| 4,977,038 A | 12/1990 | Sieradzki et al. | |
| 4,987,006 A | 1/1991 | Williams et al. | |
| 5,173,441 A | 12/1992 | Yu et al. | |
| 5,292,559 A | 3/1994 | Joyce, Jr. et al. | |
| 5,308,737 A | 5/1994 | Bills et al. | |
| 5,492,861 A | 2/1996 | Opower | |
| 5,644,353 A | 7/1997 | Sarraf | |
| 5,683,601 A | 11/1997 | Tatah | |
| 5,725,914 A | 3/1998 | Opower | |
| 5,935,758 A | 8/1999 | Patel et al. | |
| 6,025,110 A | 2/2000 | Nowak | |
| 6,155,330 A | 12/2000 | Kinane et al. | |
| 6,159,832 A | 12/2000 | Mayer | |
| 6,177,151 B1 | 1/2001 | Chrisey et al. | |
| 6,261,493 B1 | 1/2001 | Gaylo et al. | |
| 6,348,295 B1 | 2/2002 | Griffith et al. | |
| 6,412,143 B1 | 7/2002 | Chen | |
| 6,440,503 B1 | 8/2002 | Merdan et al. | |
| 6,583,381 B1 | 6/2003 | Duignan | |
| 6,600,457 B2 | 7/2003 | Heinz et al. | |
| 6,649,861 B2 | 11/2003 | Duignan | |
| 6,792,326 B1 | 9/2004 | Duignan et al. | |
| 6,805,918 B2 | 10/2004 | Auyeung et al. | |
| 6,815,015 B2 | 11/2004 | Young et al. | |
| 6,822,189 B2 | 11/2004 | Hong et al. | |
| 6,899,988 B2 | 5/2005 | Kidnie et al. | |
| 6,921,626 B2 | 7/2005 | Ray et al. | |
| 7,236,334 B2 | 6/2007 | Ding et al. | |
| 7,277,770 B2 | 10/2007 | Huang et al. | |
| 7,294,449 B1 | 11/2007 | Gudeman et al. | |
| 7,358,169 B2 | 4/2008 | Zhu et al. | |
| 7,364,996 B2 | 4/2008 | Kawase et al. | |
| 7,423,286 B2 | 9/2008 | Handy et al. | |
| 7,534,544 B2 | 5/2009 | Principe et al. | |
| 7,608,308 B2 | 10/2009 | Liu et al. | |
| 7,784,173 B2 | 8/2010 | Wolkin et al. | |
| 7,799,699 B2 | 9/2010 | Nuzzo et al. | |
| 7,938,855 B2 | 5/2011 | Gregorich et al. | |
| 7,942,987 B2 | 5/2011 | Crump et al. | |
| 7,982,296 B2 | 9/2011 | Nuzzo et al. | |
| 8,025,542 B2 | 9/2011 | Birrell et al. | |
| 8,056,222 B2 | 11/2011 | Pique et al. | |
| 8,215,371 B2 | 7/2012 | Batchelder et al. | |
| 8,216,931 B2 | 7/2012 | Zhang | |
| 8,221,822 B2 | 7/2012 | Flanagan et al. | |
| 8,262,916 B1 | 9/2012 | Smalley et al. | |
| 8,395,083 B2 | 3/2013 | Naveh et al. | |
| 8,420,978 B2 | 4/2013 | Jain et al. | |
| 8,440,546 B2 | 5/2013 | Nuzzo et al. | |
| 8,535,041 B2 | 9/2013 | Slafer | |
| 8,545,931 B2 | 10/2013 | Szuch | |
| 8,574,615 B2 | 11/2013 | Tenney et al. | |
| 8,729,524 B2 | 5/2014 | Rogers et al. | |
| 8,741,194 B1 | 6/2014 | Ederer et al. | |
| 8,743,165 B2 | 6/2014 | Sandstriim | |
| 9,027,378 B2 | 5/2015 | Crump et al. | |
| 9,029,058 B2 | 5/2015 | Martin | |
| 9,044,805 B2 | 6/2015 | Prest et al. | |
| 9,446,618 B2 | 9/2016 | Batt et al. | |
| 9,925,797 B2 | 3/2018 | Kotler et al. | |
| 2002/0085085 A1 | 7/2002 | Fischer et al. | |
| 2003/0006534 A1 | 1/2003 | Taboas et al. | |
| 2004/0069471 A1 | 4/2004 | Corduan et al. | |
| 2004/0233408 A1 | 11/2004 | Sievers | |
| 2004/0241585 A1 | 12/2004 | Kato et al. | |
| 2005/0056626 A1 | 3/2005 | Gross et al. | |
| 2005/0095367 A1 | 5/2005 | Babiarz et al. | |
| 2005/0112015 A1 | 5/2005 | Bampton | |
| 2005/0211163 A1 | 9/2005 | Li et al. | |
| 2005/0212888 A1 | 9/2005 | Lehmann et al. | |
| 2006/0076584 A1 | 4/2006 | Kim et al. | |
| 2007/0082288 A1 | 4/2007 | Wright et al. | |
| 2007/0203584 A1 | 8/2007 | Bdyopadhyay et al. | |
| 2007/0274028 A1 | 11/2007 | Hsu et al. | |
| 2008/0006966 A1 | 1/2008 | Mannella | |
| 2008/0041725 A1 | 2/2008 | Klein et al. | |
| 2008/0233291 A1 | 9/2008 | Chandrasekaran | |
| 2008/0245968 A1 | 10/2008 | Tredwell et al. | |
| 2008/0286488 A1 | 11/2008 | Li et al. | |
| 2008/0314881 A1 | 12/2008 | Ringeisen et al. | |
| 2009/0061112 A1 | 3/2009 | Kirmeier | |
| 2009/0068790 A1* | 3/2009 | Caskey | .................. H01L 24/24 438/618 |
| 2009/0074987 A1 | 3/2009 | Auyeung et al. | |
| 2009/0130427 A1 | 5/2009 | Grigoropoulos et al. | |
| 2009/0130467 A1 | 5/2009 | Liu et al. | |
| 2009/0217517 A1 | 9/2009 | Pique et al. | |
| 2010/0021638 A1 | 1/2010 | Varanka et al. | |
| 2010/0022078 A1 | 1/2010 | Rockenberger et al. | |
| 2010/0035375 A1 | 2/2010 | Grigoropoulos et al. | |
| 2010/0100635 A1 | 9/2010 | Gold et al. | |
| 2010/0227133 A1 | 9/2010 | Liu et al. | |
| 2011/0003246 A1 | 1/2011 | Kurok | |
| 2011/0097550 A1 | 4/2011 | Matusovsky et al. | |
| 2011/0136162 A1 | 6/2011 | Sun et al. | |
| 2011/0188016 A1 | 8/2011 | De Jager et al. | |
| 2011/0278269 A1 | 11/2011 | Gold et al. | |
| 2012/0015112 A1 | 1/2012 | Yang et al. | |
| 2012/0025182 A1 | 2/2012 | Umeda et al. | |
| 2012/0080088 A1 | 4/2012 | Grabitz et al. | |
| 2012/0244321 A1 | 9/2012 | Hsu et al. | |
| 2012/0247740 A1 | 10/2012 | Gertner et al. | |
| 2013/0011562 A1 | 1/2013 | Varanka et al. | |
| 2013/0029480 A1 | 1/2013 | Niklaus et al. | |
| 2013/0037838 A1 | 2/2013 | Speier et al. | |
| 2013/0176699 A1 | 7/2013 | Tonchev et al. | |
| 2013/0302154 A1 | 11/2013 | Finlayson | |
| 2013/0313756 A1 | 11/2013 | Chen et al. | |
| 2013/0335504 A1 | 12/2013 | Sandstrom et al. | |
| 2014/0001675 A1 | 1/2014 | Nakamura et al. | |
| 2014/0097277 A1 | 4/2014 | Kumta et al. | |
| 2014/0160452 A1 | 6/2014 | De Jager et al. | |
| 2014/0231266 A1 | 8/2014 | Sherrer et al. | |
| 2014/0238574 A1 | 8/2014 | Kinser et al. | |
| 2015/0001093 A1 | 1/2015 | Carter et al. | |
| 2015/0024317 A1 | 1/2015 | Orrock et al. | |
| 2015/0024319 A1 | 1/2015 | Martin | |
| 2015/0086705 A1* | 3/2015 | Meinders | ................ C23C 14/28 427/8 |
| 2015/0197063 A1 | 7/2015 | Shinar et al. | |
| 2015/0197862 A1 | 7/2015 | Engel et al. | |

(56) References Cited

U.S. PATENT DOCUMENTS

| | | | |
|---|---|---|---|
| 2015/0203984 | A1 | 7/2015 | Zhang et al. |
| 2015/0207050 | A1* | 7/2015 | Tsukada ............... H01L 24/82 |
| | | | 257/784 |
| 2015/0294872 | A1 | 10/2015 | Molpeceres Alvarez et al. |
| 2015/0097316 | A1 | 12/2015 | Desimone et al. |
| 2015/0382476 | A1 | 12/2015 | Zenou et al. |
| 2016/0218287 | A1 | 7/2016 | McAlpine et al. |
| 2016/0233089 | A1 | 8/2016 | Zenou et al. |
| 2016/0336303 | A1* | 11/2016 | Tsai ...................... H01L 21/563 |
| 2017/0021014 | A1 | 1/2017 | Boger |
| 2017/0189995 | A1 | 7/2017 | Zenou et al. |
| 2017/0210142 | A1 | 7/2017 | Kotler et al. |
| 2017/0250294 | A1 | 8/2017 | Zenou et al. |
| 2017/0306495 | A1 | 10/2017 | Kotler et al. |
| 2017/0365484 | A1 | 12/2017 | Kotler et al. |

FOREIGN PATENT DOCUMENTS

| | | |
|---|---|---|
| EP | 1847632 A1 | 10/2007 |
| EP | 2299784 A1 | 3/2011 |
| EP | 2660352 A1 | 11/2013 |
| EP | 3166143 A1 | 5/2017 |
| GB | 2453774 A | 4/2009 |
| JP | S61260603 A | 11/1986 |
| JP | H04269801 A | 9/1992 |
| JP | 0634283 A | 2/1994 |
| JP | H0634283 A | 2/1994 |
| JP | 11337227 A | 12/1999 |
| JP | 3871096 B2 | 1/2007 |
| JP | 2015144252 A | 8/2015 |
| NO | 2016116921 A1 | 7/2016 |
| WO | 2003056320 A2 | 7/2003 |
| WO | 2007134300 A2 | 11/2007 |
| WO | 2009029119 A1 | 3/2009 |
| WO | 2009062754 A1 | 5/2009 |
| WO | 2009081355 A2 | 7/2009 |
| WO | 2009153792 A2 | 12/2009 |
| WO | 2010100635 A1 | 9/2010 |
| WO | 2012066338 A2 | 5/2012 |
| WO | 2013023874 A1 | 2/2013 |
| WO | 2013037838 A1 | 3/2013 |
| WO | 2013080030 A1 | 6/2013 |
| WO | 2013124114 A1 | 8/2013 |
| WO | 2013165241 A1 | 11/2013 |
| WO | 2014061024 A1 | 4/2014 |
| WO | 2015056253 A1 | 4/2015 |
| WO | 2015155662 A1 | 10/2015 |
| WO | 2015181810 A1 | 12/2015 |
| WO | 2016063270 A1 | 4/2016 |
| WO | WO-2016116921 A1 * | 7/2016 ......... B23K 26/0648 |
| WO | 2016124712 A2 | 8/2016 |
| WO | 2017006306 A1 | 1/2017 |
| WO | WO-2017006306 A1 * | 1/2017 ............ B23K 26/57 |
| WO | 2017085712 A1 | 5/2017 |

OTHER PUBLICATIONS

Emeric et al., "Multi-jets formation using laser forward transfer", Applied Surface Science, vol. 302, pp. 153-158, year 2014.

Fardel et al., Laser-Induced Forward Transfer of Organic LED Building Blocks Studied by Time-Resolved Shadowgraphy, The journal of Physical Chemistry, vol. 114, issue 12, pp. 5617-5636, year 2010.

Zhang., "Functional Material and Application Thereof ", China Machine Press, 5 pages (relevant pp. 86-87), Jan. 2009 (only abstract is available in English).

Zenou et al., U.S. Appl. No. 15/763,451, filed Mar. 27, 2018.

International Application PCT/IL2018/050455 search report dated Jul. 30, 2018.

International Application # PCT/IL2020/050491 Search Report dated Aug. 3, 2020.

Pique et al., "Laser Forward Transfer of Electronic and Power Generating Materials", Laser Ablation and its Applications, Chapter 14, pp. 339-373, Dec. 31, 2007.

Young et al., "Dielectric properties of oxide structures by a laser-based direct-writing method", Journal of Materials Research, vol. 16, number, pp. 1720-1725, Jun. 30, 2001.

Nagel et al., "Laser-Induced Forward Transfer for the Fabrication of Devices", Nanomaterials: Processing and Characterization with Lasers, First Edition, pp. 255-316, year 2012.

Papavlu et al.,"Laser Induced Forward Transfer for Materials Patterning", Romanian Reports in Physics, vol. 63, supplement, pp. 1285-1301, year 2011.

Zergioti et al., "Microdeposition of metals by femtosecond excimer lase", Applied Surface Science, vols. 127-129, pp. 601-605, year 1998.

Vispute et al., "Reactive deposition of YIBa2Cu30 7-x superconductor films by pulsed laser ablation from an unreacted mixture of Y2O3, BaCO 3 and CuO", Bulletin of Materials Science, vol. 15, No. 4, pp. 377-384, Aug. 1992.

Hecht., "Multifrequency Acoustooptic Diffraction," IEEE Transactions on Sonics and Ultrasonics, vol. SU-24, No. 1, pp. 7-18, year 1977.

Trypogeorgos et al., "Precise shaping of laser light by an acousto-optic deflector", Optics Express, vol. 21, No. 21, pp. 24837-24846, Oct. 21, 2013.

Tan et al., "Selective surface texturing using femtosecond pulsed laser induced forward transfer", Applied Surface Scienc, vol. 207, pp. 365-371, year 2003.

Adrian et al., "A study of the mechanism of metal deposition by the laser-induced forward transfer process", Journal of Vacuum Science and Technology B, vol. 5, No. 5, pp. 1490-1494, Sep./Oct. 1987.

Baseman.,"Formation of Metal Silicon Alloys by Laser Induced Forward Transfer", An IP.com Prior Art Database Technical Disclosure, 2 pages, Jul. 1, 1988.

Gehner., "Mems Adaptive Optics Development at IPMS", Fraunhofer, Feb. 15, 2007.

Kumpulainen et al., "Low Temperature Nanoparticle Sintering with Continuous Wave and Pulse Lasers", Optics & aser Technology 43 , pp. 570-576, year 2011.

Theodorakos et al., "Selective Laser Sintering of Ag Nanoparticles Ink for Applications in Flexible Electronics", Applied Surface Science 336 , pp. 157-162, 2015.

Wang et al., "Silicon solar cells based on all-laser-transferred contacts", Progress in Photovoltaics: Research and Applications, 23 , pp. 61-68, Jul. 19, 2013.

Willis et al., "Microdroplet deposition by laser-induced forward transfer", Applied Physics Letters, vol. 86, pp. 244103-1-244103-3, year 2005.

Antonov., "Angular Splitting of the Bragg Diffraction Order in an Acoustooptical Modulator Due to a Frequency-Modulated Acoustic Wave", Technical Physics, vol. 50, No. 4, pp. 513-516, year 2005.

Banks et al., "Nanodroplets deposited in microarrays by femtosecond Ti:sapphire laser-induced forward transfer", Applied Physics Letters, vol. 89, pp. 193107-1-193107-3, year 2006.

Antonov., "Acoustooptic Nonpolar Light Controlling Devices and Polarization Modulators Based on Paratellurite Crystals", Technical Physics, vol. 49, No. 10, pp. 1329-1334, year 2004.

Antonov et al., "Improving the Efficiency of an Acoustooptic Modulator with a Two-Lobe Directivity Pattern by Correcting the Two-Frequency Electric Signal", ISSN 1063-7842, Technical Physics, vol. 51, No. 1, pp. 57-62, year 2006.

Antonov et al., "Inverse Acoustooptic Problem: Coherent Summing of Optical Beams into a Single Optical Channel", ISSN 1063-7842, Technical Physics, vol. 52, No. 5, pp. 610-615, year 2007.

Antonov et al., "Efficient Multiple-Beam Bragg Acoustooptic Diffraction with Phase Optimization of a Multifrequency Acoustic Wave", ISSN 1063-7842, Technical Physics, vol. 52, No. 8, pp. 1053-1060, year 2007.

Antonov et al., "Formation of the Multibeam Pattern of the Bragg Diffraction of Light by a Periodically Phase Modulated Acoustic Signal", ISSN 1064-2269, Journal of Communications Technology and Electronics, vol. 53, No. 4, pp. 453-459, year 2008.

(56) References Cited

OTHER PUBLICATIONS

Antonov et al., "Highly Effective Acoustooptic Diffraction of Light by Multifrequency Sound Using a Nonaxial Deflector", ISSN 1063-7842, Technical Physics, vol. 53, No. 6, pp. 752-756, year 2008.

Antonov et al., "Switch multiplexer of fiber-optic channels based on multibeam acousto-optic diffraction", Applied Optics, vol. 48, No. 7, pp. C171-C181, Mar. 1, 2009.

Zenou et al., "Laser Transfer of Metals and Metal Alloys for Digital Microfabrication of 3D Objects", SMALL, vol. 11, issue 33, pp. 4082-4089, Sep. 2, 2015.

Zenou et al., "Solar cell metallization by laser transfer of metal micro-droplets", ScienceDirect, Energy Procedia, vol. 67, pp. 147-155, year 2015.

Bera et al., "Optimization study of the femtosecond laser-induced forward-transfer process with thin aluminum films", Applied Optics, vol. 46, No. 21, pp. 4650-4659, Jul. 20, 2007.

Li et al., "Microdroplet deposition of copper film by femtosecond laser-induced forward transfer", Applied Physics etters, vol. 89, pp. 161110-4-161110-4, year 2006.

Roder et al., "Low Temperature Laser Metallization for Silicon Solar Cells", ScienceDirect, Energy Procedia, vol. 3, pp. 552-557, year 2011.

Tien et al., "Precision laser metallization", Microelectronic Engineering, vol. 56, pp. 273-279, year 2001.

Fraunhofer IPMS, Spatial Light Modulators (SLM), 2 pages, Jun. 7, 2016.

Fraunhofer IPMS, "Micro Mirror Arrays (MMA) from DUV to NIR", 2 pages, Jun. 7, 2016.

Gehner et al., "Mems AO Micro Mirror Development at IPMS", Status and Perspectives, Fraunhofer IPMS, 30 pages, May 4, 2016.

BWT Beijing, "K915FG2RN-150.0W, 915nm 150W High Power Fiber Coupled Diode Laser", 4 pages, Jul. 1, 2016.

Zenou et al., "Digital laser printing of aluminum microstructure on thermally sensitive substrates", Journal of Physics D: Applied Physics 48, 205303 12 pages, 2015.

Willis et al., "The effect of melting-induced volumetric expansion on initiation of laser-induced forward transfer", Applied Surface Science 253, pp. 4759-4763, 2007.

Schultze et al., "Laser-induced forward transfer of aluminium", Applied Surface Science 52, pp. 303-309, 1991.

Pique, A., "Laser Transfer Techniques for Digital Microfabrication", vol. 135 of the series Springer Series in Materials Science, Chapter 11, pp. 259-291, Jun. 30, 2010.

Bohandy et al., "Metal deposition from a supported metal film using an excimer laser", Journal of Applied Physics, vol. 60, No. 4, pp. 1538-1539, Aug. 15, 1986.

Vaezi et al., "A review on 3D micro-additive manufacturing technologies", The International Journal of Advanced Manufacturing Technology, vol. 67, issue 5-8, pp. 1721-1754, Jul. 2013.

Pique, A., "Rapid Prototyping of Embedded Microelectronics by Laser Direct-Write", Rapid Prototyping Technology—Principles and Functional Requirements, Chapter 12, pp. 247-272, Sep. 2011.

Biver et al., "Multi-jets formation using laser forward transfer", Applied Surface Science, vol. 302, pp. 153-158, May 30, 2014.

Barnett et al., "Integrating Electronics", 7 pages, Feb. 4, 2017.

Pique et al., "Laser Direct-Write of Embedded Electronic Components and Circuits", In Photon processing in Microelectronics and Photonics IV, vol. 5713, pp. 223-231, Apr. 1, 2005.

Baseman et al., "Laser Induced Forward Transfer", Materials research society symposium proceedings, vol. 101, pp. 237-242, year 1988.

Toth et al., "Laser-induced compound formation and transfer of stacked elemental layers", Thin Solid Films, vol. 245, issues 1-2, pp. 40-43, Jun. 1, 1994.

Komorita et al., "Oxidation state control of micro metal oxide patterns produced by using laser-induced forward transfer technique", Proceedings of 3rd International Symposium on Laser Precision Microfabrication, vol. 4830, pp. 20-24, Feb. 19, 2003.

Pique., "A novel laser transfer process for direct writing of electronic and sensor materials", Applied Physics A, Issue 69, No. 7, pp. S279-284, year 1999.

Janikowski et al., "Noncyanide Stripper Placement Program", Department of the Air Force, Air force Engineering & Services Center, Engineering & Services Laboratory, pp. 110-114, May 1989.

\* cited by examiner

ELECTRICAL INTERCONNECTION OF CIRCUIT ELEMENTS ON A SUBSTRATE WITHOUT PRIOR PATTERNING

FIELD OF THE INVENTION

The present invention relates generally to fabrication of electronic devices, and particularly to methods and apparatus for producing circuits by direct writing of conductive traces on a substrate.

BACKGROUND

In laser direct-write (LDW) techniques, a laser beam is used to create a patterned surface with spatially-resolved 3D structures by controlled material ablation or deposition. Laser-induced forward transfer (LIFT) is an LDW technique that can be applied in depositing micro-patterns on a surface.

In LIFT, laser photons provide the driving force to eject a small volume of material from a donor film toward an acceptor substrate. Typically, the laser beam interacts with the inner side of the donor film, which is coated onto a non-absorbing carrier substrate. The incident laser beam, in other words, propagates through the transparent carrier before the photons are absorbed by the inner surface of the film. Above a certain energy threshold, material is ejected from the donor film toward the surface of the substrate, which is generally placed, in LIFT systems that are known in the art, either in close proximity to or even in contact with the donor film. The applied laser energy can be varied in order to control the thrust of forward propulsion that is generated within the irradiated film volume. Nagel and Lippert survey the principles and applications of LIFT in micro-fabrication in "Laser-Induced Forward Transfer for the Fabrication of Devices," published in *Nanomaterials: Processing and Characterization with Lasers*, Singh et al., eds. (Wiley-VCH Verlag GmbH & Co. KGaA, 2012), pages 255-316.

LIFT techniques using metal donor films have been developed for a variety of applications, such as repair of electrical circuits. For example, PCT International Publication WO 2010/100635, whose disclosure is incorporated herein by reference, describes a system and method of repairing electrical circuits in which a laser is used to pre-treat a conductor repair area of a conductor formed on a circuit substrate. The laser beam is applied to a donor substrate in a manner that causes a portion of the donor substrate to be detached therefrom and to be transferred to a predetermined conductor location.

As another example, PCT International Publication WO 2015/181810, whose disclosure is incorporated herein by reference, describes a method for material deposition using a transparent donor substrate having opposing first and second surfaces and a donor film including a metal formed over the second surface. The donor substrate is positioned in proximity to an acceptor substrate, with the second surface facing toward the acceptor substrate. Pulses of laser radiation are directed to pass through the first surface of the donor substrate and impinge on the donor film so as to induce ejection from the donor film of droplets of molten material onto the acceptor substrate.

LIFT can be used to print metal traces on a variety of types of substrates. For example, PCT International Publication WO 2016/063270, whose disclosure is incorporated herein by reference, describes a method for metallization using a transparent donor substrate having deposited thereon a donor film including a metal with a thickness less than 2 µm. The donor substrate is positioned in proximity to an acceptor substrate including a semiconductor material with the donor film facing toward the acceptor substrate and with a gap of at least 0.1 mm between the donor film and the acceptor substrate. A train of laser pulses, having a pulse duration less than 2 ns, is directed to impinge on the donor substrate so as to cause droplets of the metal to be ejected from the donor layer and land on the acceptor substrate, thereby forming a circuit trace in ohmic contact with the semiconductor material.

SUMMARY

Embodiments of the present invention that are described hereinbelow provide novel techniques for interconnecting electronic components on a substrate.

There is therefore provided, in accordance with an embodiment of the invention, a method for producing electronic devices. The method includes fixing a die that includes an electronic component with integral contacts to a dielectric substrate. After fixing the die, a conductive trace is printed over both the dielectric substrate and at least one of the integral contacts, so as to create an ohmic connection between the conductive trace on the dielectric substrate and the electronic component.

In some embodiments, printing the conductive trace includes ejecting droplets of a conductive material onto both the dielectric substrate and the at least one of the integral contacts. In the disclosed embodiments, ejecting the droplets includes directing a pulsed laser beam to impinge on a donor film including the conductive material, whereby the droplets are ejected by laser-induced forward transfer (LIFT). In one embodiment, ejecting the droplets includes directing the pulsed laser beam so that the droplets are ejected toward the die at an oblique angle relative to a surface of the dielectric substrate. Additionally or alternatively, ejecting the droplets includes directing the pulsed laser beam to impinge on a first donor film including a first metal having a first melting temperature so as to form an adhesion layer on the dielectric substrate along a track of the conductive trace, and then directing the pulsed laser beam to impinge on a second donor film including a second metal having a second melting temperature, higher than the first melting temperature, so as to build up the conductive trace over the adhesion layer.

Typically, the die has opposing upper and lower sides, wherein the lower side is fixed to the dielectric substrate, and in some embodiments, the at least one of the integral contacts over which the conductive trace is printed is on the upper side. In a disclosed embodiment, ejecting the droplets includes building up a pillar from the ejected droplets alongside the electronic component from the dielectric substrate to the at least one of the integral contacts. Alternatively, the at least one of the integral contacts over which the conductive trace is printed is on one of the lateral sides, between the upper and lower sides.

In a disclosed embodiment, the method includes, prior to ejecting the droplets, forming an array of holes in the dielectric substrate so as to inhibit recoil of the droplets from the dielectric substrate.

In one embodiment, the method includes printing adhesive dots on the dielectric substrate by ejecting droplets of an adhesive material onto the dielectric substrate by laser-induced forward transfer (LIFT), wherein fixing the die includes placing the die on the adhesive dots. Additionally or alternatively, the method includes, after the die has been fixed to the dielectric substrate, ejecting droplets of an adhesive material onto the upper side of the die by LIFT.

In the disclosed embodiments, the conductive trace is printed over a locus on the dielectric substrate along which there was no conductive material prior to fixing the die. In some embodiments, printing the conductive trace includes automatically sensing a location of the at least one of the integral contacts, and printing the conductive trace responsively to the automatically-sensed location.

In some embodiments, the dielectric substrate includes a flexible foil, which may include a material selected from a group of materials consisting of polymers, papers and fabrics.

There is also provided, in accordance with an embodiment of the invention, a system for producing electronic devices. The system includes a placement station, which is configured to fix a die, which includes an electronic component with integral contacts, to a dielectric substrate. A printing station is configured to print a conductive trace over both the dielectric substrate and at least one of the integral contacts of the die that has been fixed to the dielectric substrate, so as to create an ohmic connection between the conductive trace on the dielectric substrate and the electronic component.

The present invention will be more fully understood from the following detailed description of the embodiments thereof, taken together with the drawings in which:

DETAILED DESCRIPTION OF EMBODIMENTS

Figure 1:
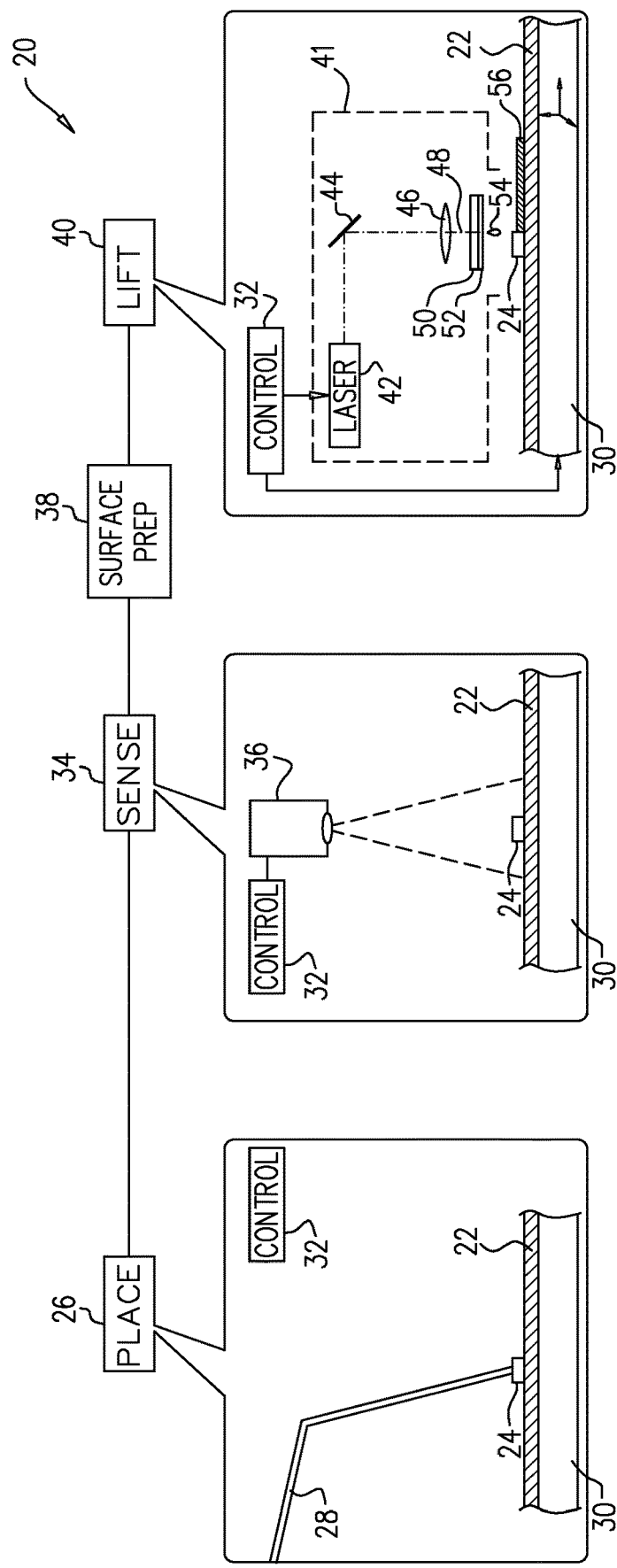
FIG. 1 is schematic side view and block diagram of a system for electronic circuit assembly, in accordance with an embodiment of the present invention.

In traditional processes for manufacture of electronic circuits, a pattern of conductive traces is first deposited on a dielectric substrate (such as a rigid or flexible printed circuit substrate). The circuit components, such as semiconductor dies and other active and passive elements, are then fixed to the substrate and connected to the traces, typically by solder or wire bonding. This is the accepted order of operations in circuit manufacture and assembly.

In modern electronic products, however, there is an increasing demand to integrate electronic circuits onto other sorts of substrates, both rigid and flexible, which may not be compatible with traditional printed circuit technology. For example, some applications call for electronic devices to be mounted and interconnected on flexible substrates, such as plastic foils, paper or fabric. Adapting traditional processes to such substrates can be challenging and costly.

Embodiments of the present invention that are described herein address this problem by reversing the accepted order of operations: First a die, which includes an electronic component with integral contacts, is fixed to the dielectric substrate, for example by a suitable adhesive. After fixing the die, a conductive trace is printed over both the dielectric substrate and at least one of the integral contacts of the die, thus creating an ohmic connection between the conductive trace on the substrate and the electronic component. Other active and passive components can be fixed to the substrate and interconnected in like manner.

Conductive traces can be printed in this manner over a locus on the dielectric substrate along which there was no conductive material prior to fixing the die. In other words, the disclosed techniques require only a single process step to perform both deposition of the traces and connection of the traces to the circuit components. To ensure accurate printing of the conductive traces, an automatic sensing system, such as a computer vision system, can be used to sense the locations of the contacts of the die after the die has been fixed to the substrate, and printing of the traces can then be guided to the sensed locations.

In the disclosed embodiments, the conductive traces are printed using a LIFT process, in which droplets of a conductive material are ejected onto both the dielectric substrate and the integral contacts of the die. (These embodiments assume that the lower side of the die is fixed to the dielectric substrate, and the integral contacts over which the conductive trace is printed are on the upper side or lateral sides of the dies.) As described in detail hereinbelow, LIFT printing of metal droplets is able to overcome large height gaps—on the order of hundreds of microns—between the substrate and the contacts on the upper side of the die, while at the same time producing very fine traces. Such traces may be printed by LIFT with line widths down to 10-20 µm, and may be trimmed (for example, by post-printing laser treatment) to even narrower widths if desired. Furthermore, LIFT printing of metals and highly viscous pastes is relatively indifferent to substrate properties, such as porosity, liquid absorbance and surface energy, and can thus print fine traces with high accuracy even on porous, absorbent substrates such as paper and fabric. This process can be used to create circuits that will afterwards withstand (within limits) bending and stretching of the substrate.

Alternatively or additionally, however, in some applications, other techniques that are known in the art for direct writing of conductive materials can be applied in creating at least some of the conductive traces.

FIG. 1 is a block diagram and side view of a system 20 for electronic circuit assembly, in accordance with an embodiment of the invention. In the pictured example, a placement station 26 places a component, such as a semiconductor die 24, on a circuit substrate 22. Placement station 26 may comprise, for example, a pick-and-place machine, in which a robotic arm 28 places components on substrate 22 under instructions from a control unit 32 in accordance with a predefined circuit layout. Typically, substrate 22 is mounted on a positioning assembly 30, such as a translation stage, to enable arm 28 to reach all desired locations. The operation of placement station 26 differs from pick-and-place machines that are known in the art, however, in that die 24 is placed on substrate 22 prior to printing of the conductive traces that will subsequently connect to the die.

Optionally, to ensure the accuracy of subsequent operations carried out in system 20, a sensing station 34 detects the actual position at which die 24 has been placed on substrate 22. Sensing station 34 comprises, for example, a camera 36, which captures images of substrate 22. Control unit 32 processes these images in order to ascertain the exact positions of the components on the substrate. Although sensing station 34 is shown in FIG. 1, for the sake of conceptual clarity, as a separate unit, in practice such sensors, such as camera 36, and sensing functionality may be integrated with the other stations in system 20. The application of sensing station 34 in system 20 is particularly advantageous in overcoming the limited accuracy of pick-and-place tools that are known in the art, as well as possible distortions that may occur in the shape of a flexible substrate in the course of the assembly process. Precise sensing of the positions of die 24 and other components enables accurate printing of very fine interconnecting traces (for example, with widths of 20 µm or less) after the components have been fixed to substrate 22.

More generally speaking, control unit 32 may adapt the traces that are to be printed depending on the actual positions of the dies in relation to other circuit components. This sort of adaptation is particularly useful, for example, when there is high density of circuit components or many input/output pins on a given die, as well as narrow lines, one should take into consideration the final (actual) position of the die in relation to the rest of the circuit. In such cases, control unit 32 selects the trace locations so as to conform with electrical design rules and avoid circuit defects. This approach can be used in creating circuits with component density as great as or even greater than is achievable using conventional manufacturing processes.

Depending on the material properties of substrate 22, a surface preparation station 38 can be used to treat the surface of the substrate 22 in order to enhance adhesion of the traces thereon. For example, when the surface is very smooth, surface preparation station 38 may create arrays of small holes in the surface, typically several microns deep and several microns across, which will roughen the surface and reduce the recoil of metal droplets from the surface in the subsequent LIFT printing stage. The holes may be made specifically in the loci of the conductive traces that are to be printed on substrate 22, or alternatively over wider areas of the substrate 22. The holes may be drilled by a laser, for example, or impressed mechanically in the surface of the substrate 22.

A printing station, for example a LIFT station 40, prints conductive traces 56 on substrate 22, in ohmic connection with the contact pads on die 24. LIFT station 40 comprises an optical assembly 41, in which a laser 42 emits pulsed radiation. Optics 46 focus laser beam 48 onto a transparent donor substrate 50 having at least one donor film 52 deposited thereon. Positioning assembly 30 positions donor substrate 50 and/or circuit substrate 22 so that the donor substrate 50 is in proximity to the upper surface of the acceptor substrate, with donor film 52 facing toward the circuit substrate and a small gap in between (typically no more than a few hundred microns, and possibly less). Although positioning assembly 30 is shown in FIG. 1, for the sake of simplicity, as a basic X-Y-Z stage below circuit substrate 22, in practice the positioning assembly 30 in LIFT station 40 additionally or alternatively may be capable of positioning donor substrate and/or elements of optical assembly 41, as will be apparent to those skilled in the art.

Donor substrate 50 typically comprises a glass or plastic sheet or other suitable transparent material, while donor film 52 comprises a suitable donor material, such as one or more pure metals and/or metal alloys. Typically, the thickness of the donor films is no more than a few microns.

Optics 46 focus beam 48 to pass through the outer surface of donor substrate 50 and to impinge on donor film 52, thereby causing droplets 54 of a fluid to be ejected from donor film 52 and fly across the gap to land on circuit substrate 22. The fluid comprises a molten form of the material in donor film 52, which then hardens on the acceptor surface to form solid pieces having a shape defined by the printing pattern. A scanner 44, such as a rotating mirror and/or an acousto-optic beam deflector under control of control unit 32, scans laser beam 48 so as to irradiate different spots on donor film 52 and thus create conductive traces 56 in the appropriate locations on circuit substrate 22.

Laser 42 comprises, for example, a pulsed Nd:YAG laser with frequency-doubled output, which permits the pulse amplitude to be controlled conveniently by control unit 32. Typically, control unit 32 comprises a general-purpose computer, with suitable interfaces for controlling and receiving feedback from optical assembly 41, positioning assembly 30, and other elements of system 20. The inventors have found that for good LIFT deposition results, the optimal pulse duration is in the range of 0.1 ns to 1 ns, but longer or shorter pulses may be used, depending on application requirements. Optics 46 are similarly controllable in order to adjust the size of the focal spot formed by the laser beam on donor film 52.

The size of droplets 54 is determined, inter alia, by the laser pulse energy, duration, and focal spot size and the thickness of the donor film. The above-mentioned PCT International Publication 2015/181810, for example, describes LIFT techniques and parameters that can be applied so that each laser pulse causes a single, relatively large droplet to be ejected from the donor film. These techniques and parameters can be applied advantageously in LIFT station 40, since the droplets are ejected toward circuit substrate 22 with accurate directionality, making it possible to hold donor film 52 at a distance of at least 100 µm from the acceptor substrate during ejection of the droplets and to create the desired structures with precision.

In some embodiments, LIFT station 40 causes droplets 54 of two or more different fluids, having different compositions, to be ejected from different donor films 52. For example, the different fluids can be ejected by directing beam 48 from laser 42 to impinge on different areas of donor films 52 (either on the same donor substrate 50 or different donor substrates) containing different materials. The different fluids may be ejected sequentially toward the same location on circuit substrate 22 and/or toward different locations, in order to print the desired traces 56.

For example, to enhance adhesion of traces 56 to certain types of circuit substrates, such as polymer substrates, a first donor film 52 comprising a metal with a low melting temperature, such as tin or a tin alloy, is used in printing an initial adhesion layer along the loci of the traces. The low-temperature metal droplets cool quickly while at the same time locally melting the polymer, thus forming a layer to which subsequent laser droplets with higher temperature and energy will readily adhere. (This adhesion layer need not be dense or fully coat the substrate. A low-density adhesion layer, covering no more than 20-30% of the intended area of trace 56, is often sufficient to anchor the subsequent structural layer.) Thereafter, a second donor film 52 with a structural metal, such as copper (and/or aluminum or nickel, for example) is printed over the adhesion layer in order to reach the desired dimensions, connectivity and conductivity of the trace. As noted earlier, control unit 32 controls scanner 44 and other elements of optical assembly 41 so as to write donor material from films 52 to the appropriate locations on circuit substrate 22 and to make multiple passes, as needed, in order to build up the deposited volume of the donor material to the desired thickness.

Figure 2A:
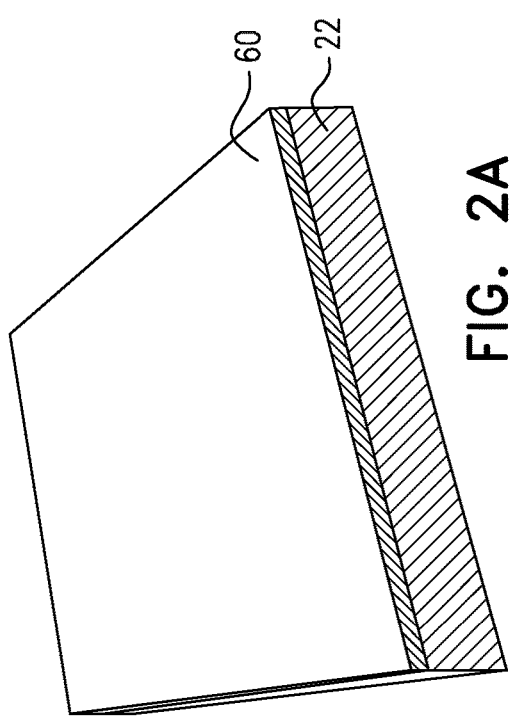
FIGS. 2A-2D are schematic pictorial illustrations showing successive stages in the production of an electronic circuit, in accordance with an embodiment of the invention.
Figure 2B:
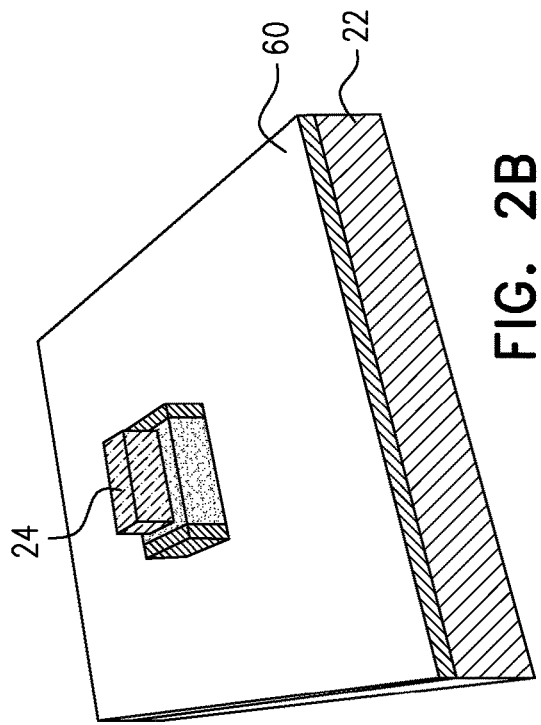

FIGS. 2A-2D are schematic pictorial illustrations showing successive stages in the production of an electronic circuit, in accordance with an embodiment of the invention. As a preliminary step, shown in FIG. 2A, substrate 22 is coated with an adhesive layer 60 or, alternatively, a suitable pattern of adhesive, such as an array of adhesive dots (not shown), which may also be printed by a LIFT process. (LIFT printing of adhesive may also be used in printing dots of adhesive, when needed, on top of die 24 and other circuit components.) Die 24 is then fixed in position, for example by placement station 26, with the lower side of the die 24 resting on adhesive layer 60, as illustrated in FIG. 2B. After all components have been placed on substrate 22, adhesive layer 60 may be cured (for example by application of ultraviolet radiation or heat) in order to hold the components securely in place.

Figure 2C:
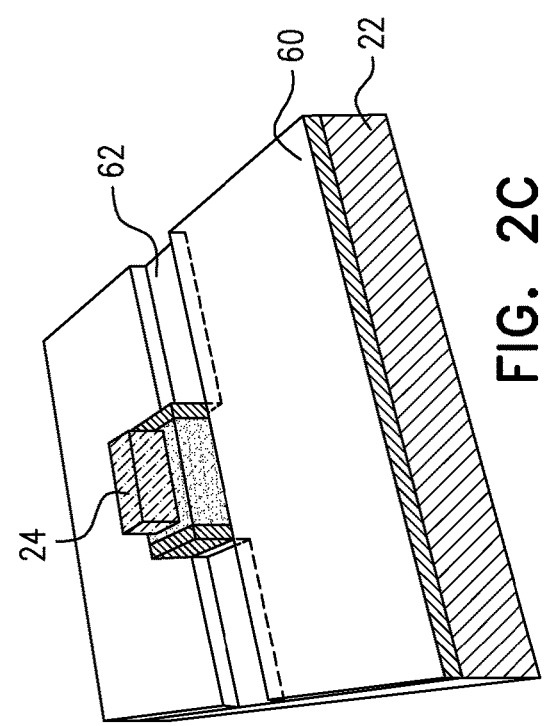

When necessary, surface preparation station 38 prepares tracks 62 on substrate 22, as shown in FIG. 2C, over which traces 56 will subsequently be printed. As explained earlier, such preparation is advantageous for materials that are not inherently sufficiently rough to capture and hold the droplets printed by LIFT station 40. Tracks 62 may contain, for example, an array of shallow holes with a diameter that is one to two times the diameter of droplets 54 and depth of roughly 3-6 µm. Alternatively or additionally, LIFT station may be operated to create an initial metal adhesion layer, as explained above. On the other hand, surface preparation before LIFT printing may not be needed on substrate materials that are sufficiently porous.

Figure 2D:
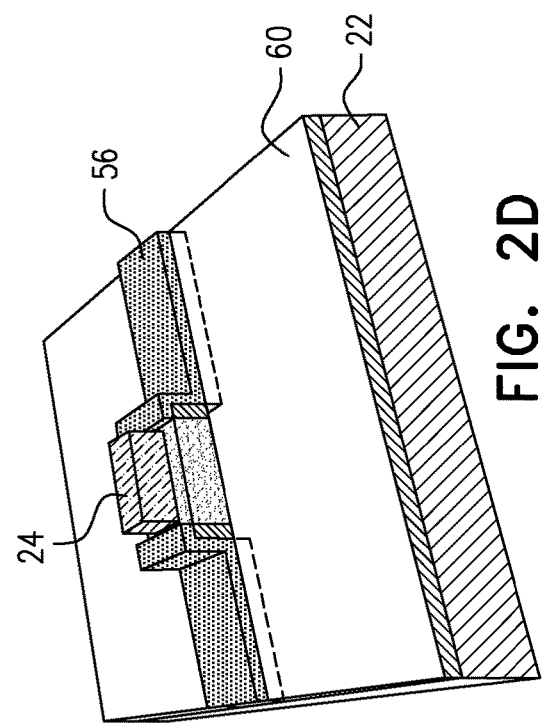
Figure 4A:
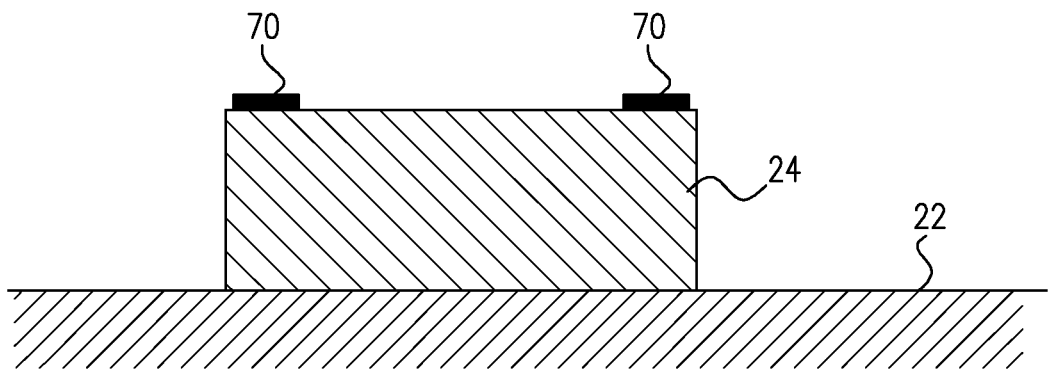
FIGS. 4A-C are schematic side views of an electronic component on a substrate, showing successive stages in connection of a circuit trace to the electronic component, in accordance with an embodiment of the invention.
Figure 4B:
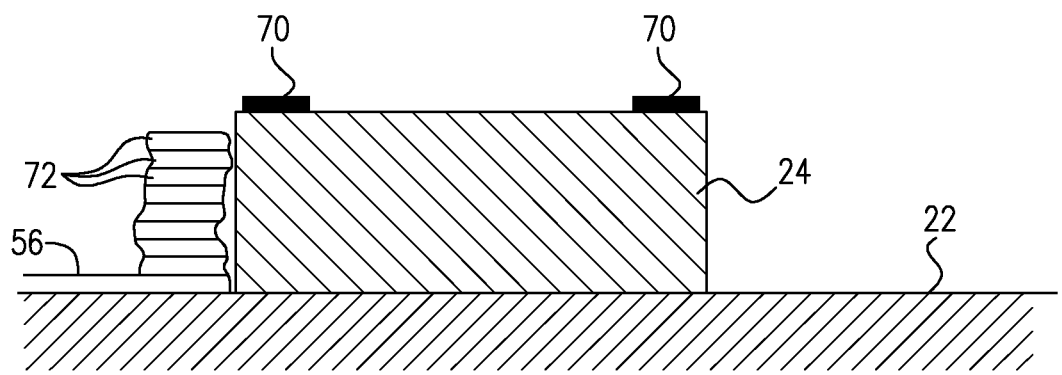
Figure 4C:
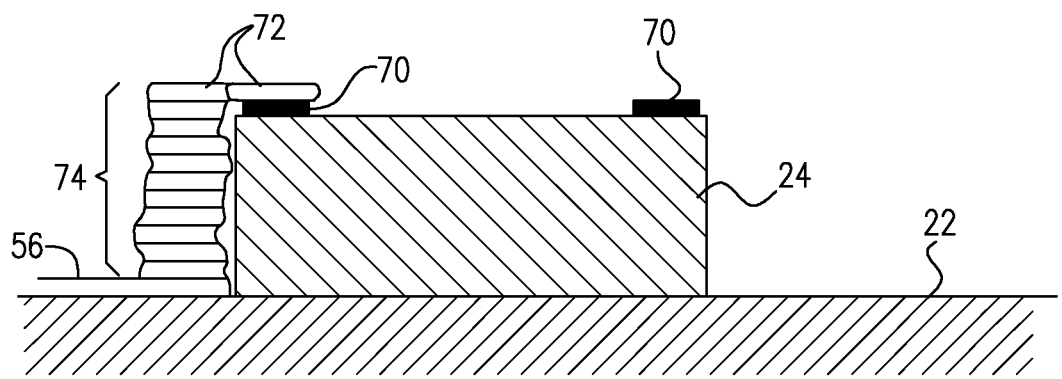

Finally, conductive trace 56 is printed by LIFT station 40 over both substrate 22 and the integral contacts on the upper side of die 24, as shown in FIG. 2D. Trace 56 is built up over the edges of die 24 in order to connect with the contacts of the die. (Details of an implementation of this latter step are shown in FIGS. 4A-C.) Although LIFT station 40 is capable of printing very fine traces, as explained above, in some cases wider and/or thicker conductive traces may be printed in order to sink heat away from the circuit components in operation.

Figure 3:
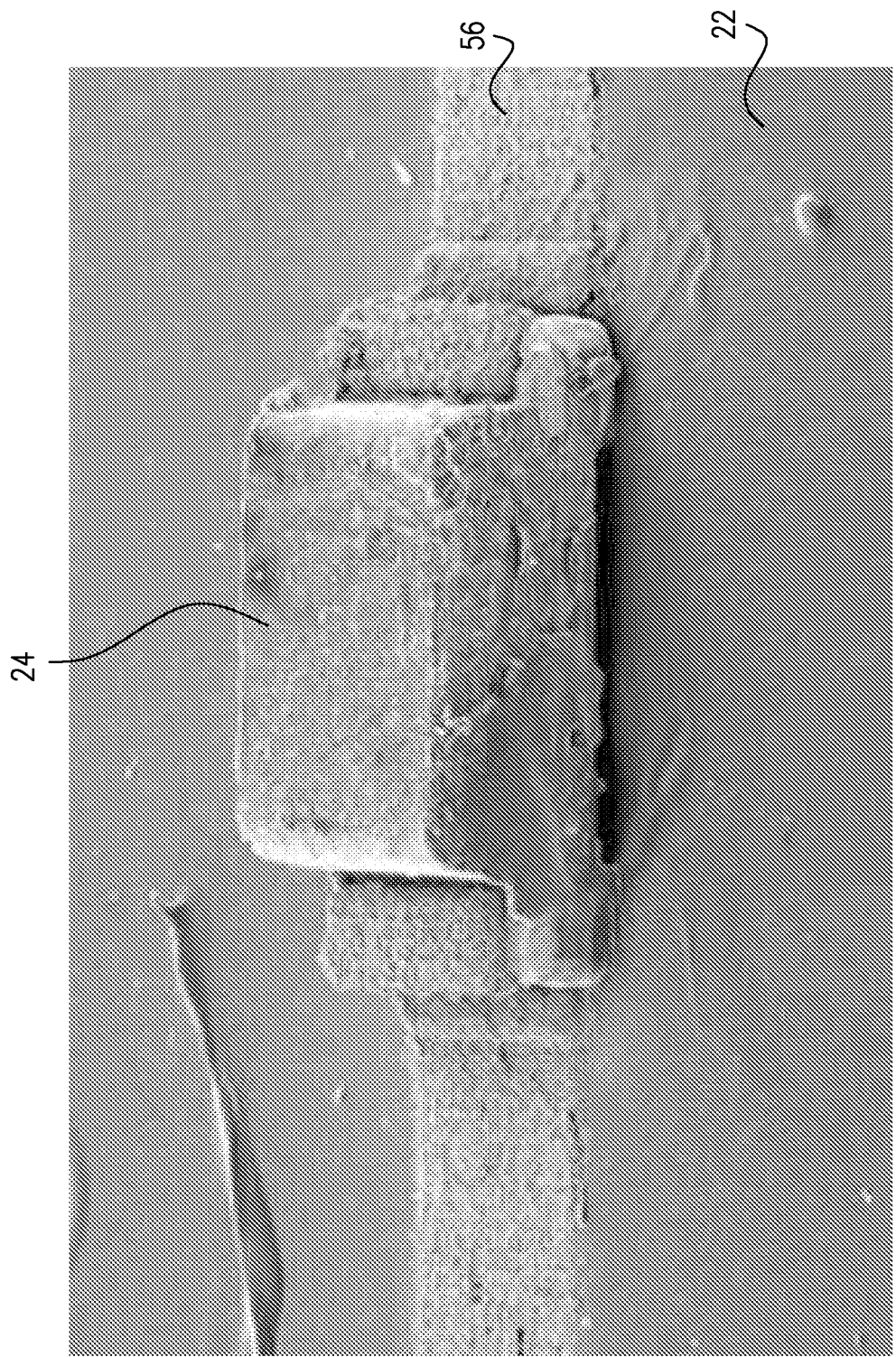
FIG. 3 is an image captured by a scanning electron microscope (SEM) of an electronic component assembled into a circuit in accordance with an embodiment of the invention.

FIG. 3 is an image captured by a scanning electron microscope (SEM) of an actual die 24 assembled onto substrate 22 in accordance with an embodiment of the invention. Substrate 22 in this example is a polyethylene terephthalate (PET) foil, while die 24 comprises an LED in a surface-mount package. Traces 56 are built up from LIFT droplets and extend over the "shoulders" of the die to reach the contact pads on the upper side. Application of a suitable voltage between traces 56 on the opposing sides of die 24 caused the LED to emit light.

FIGS. 4A-C are schematic side views of die 24 on substrate 22, showing successive stages in connection of a circuit trace to contacts 70 on the upper side of the die 24, in accordance with an embodiment of the invention. After initial placement of die 24, as shown in FIG. 4A, LIFT station 40 deposits successive droplets 72 to create a pillar 74 up to contact 70, as shown in FIGS. 4B-C. The inventors have created pillars of this sort with widths of 10-20 µm by building up piles of single droplets 54. As the height of pillar 74 grows, positioning assembly 30 may move donor substrate 50 away from circuit substrate in order to maintain a sufficient gap between the donor and acceptor surfaces.

It is desirable to build a small tilt into the pillar (on the order of 3°) to prevent gaps from opening between the pillar and the die contacts. Additionally or alternatively, angled LIFT printing, in which droplets are ejected from donor film 52 at an oblique (non-perpendicular) angle relative to the surface of substrate 22, may be applied in order to conformally coat the lateral sides of the die with metal without gaps between the pillar and the die, and thus enhance the mechanical robustness of the traces and connections. Angled LIFT printing techniques that can be used in this regard are described, for example, in PCT International Publication WO 2016/116921, whose disclosure is incorporated herein by reference.

Pillar 74 takes the place of wire-bonding, which is used to creating this sort of contact in electronic devices that are known in the art. The use of LIFT to create such contacts both enhances robustness of the device against mechanical shock and can reduce overall size, since there is no need to leave space around the components for connection of the wire bonds.

Although the examples shown in the figures and described above relate to particular types of components, the principles of the present invention may be applied in assembling circuits comprising a wide variety of different sorts of components, including (but not limited to):
Semiconductor dies.
Active devices, such as batteries, photovoltaics, sensors, optoelectronics, thin-film devices, and MEMS devices.
Pre-assembled hybrid devices, such as rigid or flexible foils with components already mounted on them.
Surface-mount devices, such as discrete transistors, capacitors, inductors and resistors.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for producing electronic devices, the method comprising:
fixing a die that includes an electronic component with integral contacts to a dielectric substrate, wherein the die is disposed outside of a body of the dielectric substrate such that the die extends above a surface of the dielectric substrate; and
after fixing the die, printing a conductive trace over both the dielectric substrate and at least one of the integral contacts, so as to create an ohmic connection between the conductive trace on the dielectric substrate and the electronic component, wherein printing the conductive trace comprises ejecting droplets of a conductive material onto both the dielectric substrate and the at least one of the integral contacts, wherein ejecting the droplets comprises directing a pulsed laser beam to impinge on a donor film comprising the conductive material, whereby the droplets are ejected by laser-induced forward transfer (LIFT), wherein the die has opposing upper and lower sides and a planar surface connecting the upper and lower sides, wherein the lower side is fixed to the dielectric substrate, wherein the at least one of the integral contacts over which the conductive trace is printed is on the upper side, wherein ejecting the droplets comprises directing the pulsed laser beam to impinge on a first donor film comprising a first metal having a first melting temperature so as to form an adhesion layer on the dielectric substrate along a track of the conductive trace, and then directing the pulsed laser beam to impinge on a second donor film comprising a second metal having a second melting temperature, higher than the first melting temperature, so as to build up the conductive trace over the adhesion layer, wherein ejecting the droplets comprises building up a pillar using the ejected droplets alongside the electronic component from the dielectric substrate to the at least one of the integral contacts, wherein the pillar is non-perpendicular with the dielectric substrate such that the pillar tilts into the planar surface, and wherein at least one of the droplets on the at least one of the integral contacts is adjacent the pillar and connects the at least one of the integral contacts to the pillar.

2. The method according to claim 1, wherein ejecting the droplets comprises directing the pulsed laser beam so that the droplets are ejected toward the die at an oblique angle relative to the surface of dielectric substrate.

3. The method according to claim 1, wherein the die has lateral sides between the upper and lower sides, and wherein the at least one of the integral contacts over which the conductive trace is printed is apart from one of the lateral sides.

4. The method according to claim 1, and comprising prior to ejecting the droplets, forming an array of holes in the dielectric substrate so as to inhibit recoil of the droplets from the dielectric substrate.

5. The method according to claim 1, and comprising printing adhesive dots on the dielectric substrate by ejecting droplets of an adhesive material onto the dielectric substrate by the laser-induced forward transfer (LIFT), wherein fixing the die comprises placing the die on the adhesive dots.

6. The method according to claim 1, wherein the method comprises, after the die has been fixed to the dielectric substrate, ejecting droplets of an adhesive material onto the upper side of the die by the laser-induced forward transfer (LIFT).

7. The method according to claim 1, wherein the conductive trace is printed over a locus on the dielectric substrate along which there was no conductive material prior to fixing the die.

8. The method according to claim 7, wherein printing the conductive trace comprises automatically sensing a location of the at least one of the integral contacts, and printing the conductive trace responsively to the automatically-sensed location.

9. The method according to claim 1, wherein the dielectric substrate comprises a flexible foil.

10. The method according to claim 9, wherein the flexible foil comprises a material selected from a group of materials consisting of polymers, papers and fabrics.

11. A system for producing electronic devices, the system comprising:
a placement station, which is configured to fix a die, which includes an electronic component with integral contacts, to extend above a surface of a dielectric substrate such that the die is disposed outside of a body of the dielectric substrate; and
a printing station, which is configured to print a conductive trace over both the dielectric substrate and at least one of the integral contacts of the die that has been fixed to the substrate, so as to create an ohmic connection between the conductive trace on the substrate and the electronic component, wherein the printing station is configured to print the conductive trace by ejecting droplets of a conductive material onto both the dielectric substrate and the at least one of the integral contacts, wherein the printing station comprises a laser, which is configured to emit a pulsed laser beam to impinge on a donor film comprising the conductive material, whereby the droplets are ejected by laser-induced forward transfer (LIFT), wherein the die has opposing upper and lower sides and a planar surface connecting the upper and lower sides, wherein the lower side is fixed to the dielectric substrate, wherein the at least one of the integral contacts over which the conductive trace is printed is on the upper side, wherein the printing station comprises optics, which are configured to direct the pulsed laser beam to impinge on a first donor film comprising a first metal having a first melting temperature so as to form an adhesion layer on the dielectric substrate along a track of the conductive trace, and then to direct the pulsed laser beam to impinge on a second donor film comprising a second metal having a second melting temperature, higher than the first melting temperature, so as to build up the conductive trace over the adhesion layer, wherein the printing station is configured to build up a pillar using the ejected droplets alongside the electronic component from the dielectric substrate to the at least one of the integral contacts, wherein the pillar is non-perpendicular with the dielectric substrate such that the pillar tilts into the planar surface, and wherein at least one of the droplets on the at least one of the integral contacts is adjacent the pillar and connects the at least one of the integral contacts to the pillar.

12. The system according to claim 11, wherein the printing station is configured to direct the pulsed laser beam so that the droplets are ejected toward the die at an oblique angle relative to the surface of the dielectric substrate.

13. The system according to claim 11, wherein the die has lateral sides between the upper and lower sides, and wherein the at least one of the integral contacts over which the conductive trace is printed is apart from one of the lateral sides.

14. The system according to claim 11, and comprising a surface preparation station, which is configured to form an array of holes in the substrate prior to ejecting the droplets so as to inhibit recoil of the droplets from the dielectric substrate.

15. The system according to claim 11, wherein the printing station is configured to print adhesive dots on the dielectric substrate by ejecting droplets of an adhesive material onto the dielectric substrate by the laser-induced forward transfer (LIFT), and wherein the placement station is configured to place the die on the adhesive dots.

16. The system according to claim 11, wherein the printing station is configured to eject droplets of an adhesive material onto the upper side of the die by the laser-induced forward transfer (LIFT) after the die has been fixed to the dielectric substrate.

17. The system according to claim 11, wherein the conductive trace is printed over a locus on the dielectric substrate along which there was no conductive material prior to fixing the die.

18. The system according to claim 17, and comprising a sensor, which is configured to automatically sense a location of the at least one of the integral contacts, wherein the printing station is configured to print the conductive trace responsively to the automatically-sensed location.

19. The system according to claim 11, wherein the dielectric substrate comprises a flexible foil.

20. The system according to claim 19, wherein the flexible foil comprises a material selected from a group of materials consisting of polymers, papers and fabrics.

* * * * *